United States Patent
Hwang

(10) Patent No.: US 12,081,511 B2
(45) Date of Patent: Sep. 3, 2024

(54) SYSTEM FOR AUTOMATICALLY ASSIGNING ID TO SLAVE BMS

(71) Applicant: LG ENERGY SOLUTION, LTD., Seoul (KR)

(72) Inventor: Ji Won Hwang, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 478 days.

(21) Appl. No.: 17/609,718

(22) PCT Filed: Apr. 17, 2020

(86) PCT No.: PCT/KR2020/005186
§ 371 (c)(1),
(2) Date: Nov. 8, 2021

(87) PCT Pub. No.: WO2020/226297
PCT Pub. Date: Nov. 12, 2020

(65) Prior Publication Data
US 2022/0217118 A1    Jul. 7, 2022

(30) Foreign Application Priority Data
May 9, 2019   (KR) .................. 10-2019-0054532

(51) Int. Cl.
*H04L 61/3015*        (2022.01)
*G01R 31/371*         (2019.01)
(Continued)

(52) U.S. Cl.
CPC ........ *H04L 61/3015* (2013.01); *G01R 31/371* (2019.01); *H01M 10/4207* (2013.01);
(Continued)

(58) Field of Classification Search
None
See application file for complete search history.

(56) References Cited

U.S. PATENT DOCUMENTS 8,679,658 B2   3/2014  Karlsson et al.
9,735,452 B2   8/2017  Min
(Continued)

FOREIGN PATENT DOCUMENTS

EP   3 654 439 A1   5/2020
JP   5717266 B2     5/2015
(Continued)

OTHER PUBLICATIONS

Extended European Search Report Application No. 20802249.1 issued on Jul. 15, 2022.
(Continued)

*Primary Examiner* — Alex Skripnikov
(74) *Attorney, Agent, or Firm* — Birch, Stewart, Kolasch & Birch, LLP

(57) ABSTRACT

Disclosed is a master battery management system (BMS) including: a transmission unit for transmitting a cell balancing start command signal and a temperature measurement command signal to a plurality of slave BMSs; a wired communication unit for transmitting a FAN ON signal to a plurality of fans after the transmission unit wirelessly transmits the cell balancing start command signal; a reception unit for receiving an association signal from an associated slave BMS having a difference in temperature of a printed circuit board (PCB) board of a corresponding slave BMS and a temperature of a PCB substrate of a corresponding slave BMS that is greater than a preset value; and a control unit for determining that the associated slave BMS is disposed in the same rack, and changing an ID and communication channel of the associated slave BMS to a specific value.

16 Claims, 9 Drawing Sheets

(51) Int. Cl.
*H01M 10/42* (2006.01)
*H01M 10/48* (2006.01)
*H02J 7/00* (2006.01)
*H04B 17/318* (2015.01)

(52) U.S. Cl.
CPC ......... *H01M 10/425* (2013.01); *H01M 10/48* (2013.01); *H01M 10/482* (2013.01); *H01M 10/486* (2013.01); *H02J 7/0014* (2013.01); *H02J 7/0047* (2013.01); *H04B 17/318* (2015.01); *H01M 2010/4271* (2013.01); *H01M 2010/4278* (2013.01)

(56) References Cited

U.S. PATENT DOCUMENTS

| | | | |
|---|---|---|---|
| 10,396,570 B2 * | 8/2019 | Loncarevic | H02J 7/0014 |
| 11,125,824 B2 * | 9/2021 | Lee | H02J 1/106 |
| 2011/0175574 A1 | 7/2011 | Sim et al. | |
| 2012/0112685 A1 | 5/2012 | Hartley et al. | |
| 2013/0271072 A1 | 10/2013 | Lee et al. | |
| 2013/0314094 A1 | 11/2013 | Farmer et al. | |
| 2014/0002003 A1 * | 1/2014 | Kim | H02J 7/0019 429/61 |
| 2014/0091769 A1 | 4/2014 | Kim et al. | |
| 2014/0115191 A1 | 4/2014 | Kim et al. | |
| 2014/0145678 A1 * | 5/2014 | Hwang | H02J 3/32 320/118 |
| 2014/0147711 A1 | 5/2014 | Takeda et al. | |
| 2014/0347014 A1 | 11/2014 | Lee et al. | |
| 2014/0370940 A1 | 12/2014 | Yoshida | |
| 2015/0028816 A1 | 1/2015 | Lee | |
| 2015/0160077 A1 | 6/2015 | Min | |
| 2017/0214256 A1 | 7/2017 | Hardy | |
| 2017/0219656 A1 | 8/2017 | Kim | |
| 2017/0365893 A1 | 12/2017 | Kim et al. | |
| 2019/0129369 A1 | 5/2019 | Song et al. | |
| 2019/0260097 A1 | 8/2019 | Kwon et al. | |
| 2019/0265304 A1 * | 8/2019 | Kim | B60L 58/12 |
| 2019/0273293 A1 | 9/2019 | Kim et al. | |
| 2019/0305386 A1 * | 10/2019 | Lee | G01R 31/392 |
| 2019/0339335 A1 * | 11/2019 | Kim | G01R 31/3835 |
| 2020/0036194 A1 | 1/2020 | Park et al. | |
| 2020/0059106 A1 * | 2/2020 | Karlsson | H01M 10/425 |
| 2020/0176825 A1 | 6/2020 | Park et al. | |
| 2021/0109492 A1 | 4/2021 | Song et al. | |
| 2021/0336301 A1 * | 10/2021 | Hwang | H01M 10/486 |
| 2021/0408804 A1 * | 12/2021 | Kanai | H01M 10/482 |

FOREIGN PATENT DOCUMENTS

| | | |
|---|---|---|
| JP | 2015-177234 A | 10/2015 |
| KR | 10-2011-0013747 A | 2/2011 |
| KR | 10-2013-0026249 A | 3/2013 |
| KR | 10-2014-0015273 A | 2/2014 |
| KR | 10-1764472 B1 | 8/2017 |
| KR | 10-2017-0142053 A | 12/2017 |
| KR | 10-2018-0094353 A | 8/2018 |
| KR | 10-1924527 B1 | 12/2018 |
| KR | 10-2019-0005408 A | 1/2019 |
| KR | 10-2019-0012981 A | 2/2019 |
| KR | 10-2019-0031990 A | 3/2019 |
| KR | 10-2019-0040414 A | 4/2019 |
| KR | 10-2019-0048673 A | 5/2019 |
| WO | WO 2013/014758 A1 | 1/2013 |
| WO | WO 2019/009531 A1 | 1/2019 |
| WO | WO 2019/059565 A1 | 3/2019 |
| WO | WO 2019/074217 A1 | 4/2019 |

OTHER PUBLICATIONS

International Search Report for PCT/KR2020/005186 (PCT/ISA/210) mailed on Jul. 24, 2020.

* cited by examiner

SYSTEM FOR AUTOMATICALLY ASSIGNING ID TO SLAVE BMS

TECHNICAL FIELD

Mutual Citations with Related Applications

This application claims the benefit of priority based on Korean Patent Application No. 10-2019-0054532 filed on May 9, 2019, and all contents disclosed in the literature of the Korean patent application are incorporated as part of this specification.

TECHNICAL FIELD

The present invention relates to a system in which a master battery management system (BMS) automatically allocates an ID to a slave BMS in the same battery rack.

BACKGROUND ART

Recently, research and development on secondary batteries have been actively conducted. Here, the secondary batteries, as batteries that can be charged and discharged, mean that they include conventional Ni/Cd batteries and Ni/MH batteries, and recent lithium ion batteries. Among the secondary batteries, the lithium ion battery has an advantage that the energy density is much higher than that of the conventional Ni/Cd battery and Ni/MH battery, and further, the lithium ion battery can be manufactured with a tendency of a small size so that it is used as a power source for a mobile apparatus. In addition, the usage range of the lithium ion battery extends as a power source for electric vehicles, so that the lithium ion battery attracts attention as a next generation energy storage medium.

In addition, a secondary battery is generally used as a battery pack including a battery module in which a plurality of battery cells are connected in series and/or in parallel. And, a state and an operation of a battery pack are managed and controlled by a battery management system.

A plurality of battery modules are connected in series/parallel to form a battery rack, and a plurality of battery racks are connected in parallel to form a battery bank. Such a battery bank can be used as an energy storage system (ESS). Each battery module is monitored and controlled by the corresponding slave BMS. The master BMS, which is the top-level controller in each battery rack, monitors and controls each slave BMS, and monitors and controls the entire battery rack status based on the information obtained from the slave BMS.

At this time, when the slave BMS and the master BMS of a plurality of battery racks wirelessly communicate with each other in the same space, a corresponding signal may be transmitted to a battery rack other than the battery rack. Therefore, there is a problem in that after initial installation of the ESS, each master BMS automatically identifies a slave BMS placed in the same battery rack to allocate an ID to the corresponding slave BMS.

DISCLOSURE

Technical Problem

An object of the present invention is to automatically allocate an ID of a slave BMS disposed in a corresponding battery rack by a master BMS disposed in each battery rack in an ESS including a plurality of battery racks.

Technical Solution

According to an embodiment of the present invention, a master BMS includes: a transmission unit configured to wirelessly transmit a cell balancing start command signal and a temperature measurement command signal at least two times to a plurality of slave BMSs; a wired communication unit configured to transmit a FAN ON signal to a plurality of fans connected together after the transmission unit wirelessly transmits the cell balancing start command signal; a reception unit configured to receive an association signal from an associated slave BMS, among the plurality of slave BMSs, having that is a slave BMS in which a difference value between a temperature of a printed circuit board (PCB) board of a corresponding slave BMS measured based on the temperature measurement command signal transmitted immediately after the cell balancing start command signal and a temperature of a PCB substrate of a corresponding slave BMS measured based on the temperature measurement command signal transmitted after the FAN ON signal transmission greater than a preset value; and a control unit configured to determine that the associated slave BMS is disposed in the same rack, and change an ID and communication channel of the associated slave BMS to a specific value.

According to an embodiment of the present invention, the transmission unit of the master BMS transmits a signal for signal strength measurement to a plurality of associated slave BMSs, wherein the reception unit receives a Received Signal Strength Indication (RSSI) level for a reception strength of the signal strength measurement signal received by a corresponding associated slave BMS from each of the plurality of associated slave BMSs.

According to an embodiment of the present invention, the master BMS further includes an ID allocation unit configured to allocate an n-th control ID (n is a natural number) to a first associated slave BMS among the plurality of associated BMSs that transmits the largest RSSI level based on the RSSI level received from each of the plurality of associated slave BMSs.

In the master BMS according to an embodiment of the present invention, after allocating the n-th ID, the reception unit receives the RSSI level for the reception strength of the signal strength measurement signal received from the associated slave BMS to which the n-th ID is allocated by a plurality of associated slave BMSs except for the associated slave BMS to which the ID is allocated by the ID allocation unit, wherein the ID allocation unit allocates an (n+1)-th ID to an associated slave BMS transmitting the largest RSSI level based on the RSSI level received from each of the plurality of associated slave BMSs except for the associated slave BMS to which the ID is allocated.

In the master BMS according to an embodiment of the present invention, the control unit allows the ID allocation unit to repeat the ID allocation operation until n+1, which is the number of IDs allocated by the ID allocation unit, is equal to the number of associated slave BMSs transmitting the association signal.

In the master BMS according to an embodiment of the present invention, the master BMS transmits the cell balancing start command signal and the temperature measurement command signal in a broadcast manner.

In the slave BMS according to an embodiment of the present invention, the slave BMS includes: a reception unit configured to wirelessly receive a cell balancing start command signal and a temperature measurement command signal at least two times from a predetermined master BMS;

a cell balancing unit configured to perform cell balancing when a strength of the cell balancing start command signal is greater than a preset strength; a temperature measurement unit configured to measure a temperature of a PCB substrate a plurality of times based on the temperature measurement command signal of the at least two times; and a transmission unit configured to transmit an association signal to the master BMS when a difference between a first temperature and a second temperature, which are temperatures of the battery module measured based on the temperature measurement command signal of the at least two times, is greater than a preset value.

In the slave BMS according to an embodiment of the present invention, when the association signal is transmitted, the reception unit receives a signal for signal strength measurement, wherein the slave BMS further includes an RSSI level detection unit configured to detect an RSSI level for strength of the signal for the signal strength measurement, wherein the transmission unit transmits the detected RSSI level to the master BMS.

In the slave BMS according to an embodiment of the present invention, the reception unit receives ID allocation information from the master BMS, wherein the slave BMS further includes a control unit configured to generate a signal for signal strength measurement to allows the transmission unit to transmit the signal for signal strength measurement to at least one other associated slave BMS when receiving the ID allocation information.

In the slave BMS according to an embodiment of the present invention, when the strength of the cell balancing start command signal is equal to or less than a preset strength, the master BMS transmitting the cell balancing start command signal determines that the corresponding slave BMS is a master BMS placed in another rack.

According to an embodiment of the present invention, an automatic ID allocation system of an associated slave BMS in a battery rack where a specific master BMS is disposed, the automatic ID allocation system including: a master BMS including: a transmission unit configured to wirelessly transmit a cell balancing start command signal and a temperature measurement command signal of at least two times to a plurality of slave BMSs; a wired communication unit configured to transmit a FAN ON signal to a plurality of fans connected by wire after the transmission unit wirelessly transmits the cell balancing start command signal; a reception unit configured to receive an association signal from an associated slave BMS that is a slave BMS in which a difference value between a temperature of a PCB board of a corresponding slave BMS measured based on the temperature measurement command signal transmitted immediately after the cell balancing start command signal and a temperature of a PCB substrate of a corresponding slave BMS measured based on the temperature measurement command signal transmitted after the FAN ON signal transmission among the plurality of slave BMSs is greater than a preset value; and a control unit configured to determine that the associated slave BMS is disposed in the same rack, and change an ID and communication channel of the associated slave BMS to a specific value; and a slave BMS including: a reception unit configured to wirelessly receive a cell balancing start command signal and a temperature measurement command signal at least two times from a predetermined master BMS; a cell balancing unit configured to perform cell balancing when a strength of the cell balancing start command signal is greater than a preset strength; a temperature measurement unit configured to measure a temperature of a PCB substrate a plurality of times based on the temperature measurement command signal of the at least two times; and a transmission unit configured to transmit an association signal to the master BMS when a difference between a first temperature and a second temperature, which are temperatures of the battery module measured based on the temperature measurement command signal of the at least two times, is greater than a preset value.

In the automatic ID allocation system of the slave BMS according to an embodiment of the present invention, when the difference between the first temperature and the second temperature of the slave BMS is greater than the preset value, the slave BMS being the associated slave BMS.

In the automatic ID allocation system of the slave BMS according to an embodiment of the present invention, the first transmission unit transmits a first signal to the associated slave BMS, wherein the slave BMS further includes an RSSI level detection unit configured to detect an RSSI level for the reception strength of the first signal received by the second reception unit.

In the automatic ID allocation system of the slave BMS according to an embodiment of the present invention, the second transmission unit transmits the RSSI level value for the reception strength of the first signal to the master BMS, wherein the master BMS further includes an ID allocation unit configured to allocate an n-th ID (n is a natural number) corresponding to the slave BMS when the RSSI level value received from the slave BMS is greater than the RSSI level value received from another associated slave BMS, wherein the first transmission unit transmits the n-th ID allocation information to the slave BMS.

In the automatic ID allocation system of the slave BMS according to an embodiment of the present invention, after allocating the n-th ID, the reception unit receives the RSSI level for the reception strength of the signal strength measurement signal received from the associated slave BMS to which the n-th ID is allocated by a plurality of associated slave BMSs except for the associated slave BMS to which the ID is allocated by the ID allocation unit, wherein the ID allocation unit allocates an (n+1)-th ID to an associated slave BMS transmitting the largest RSSI level based on the RSSI level received from each of the plurality of associated slave BMSs except for the associated slave BMS to which the ID is allocated.

In the automatic ID allocation system of the slave BMS according to an embodiment of the present invention, the control unit allows the ID allocation unit to repeat the ID allocation operation until n+1, which is the number of IDs allocated by the ID allocation unit, is equal to the number of associated slave BMSs transmitting the association signal.

Advantageous Effects

According to embodiments of the present invention, the master BMS disposed in each battery rack in the ESS including a plurality of battery racks automatically allocates the IDs of the slave BMSs disposed in the battery rack, thereby efficiently managing the ESS.

BEST MODE

Figure 1:
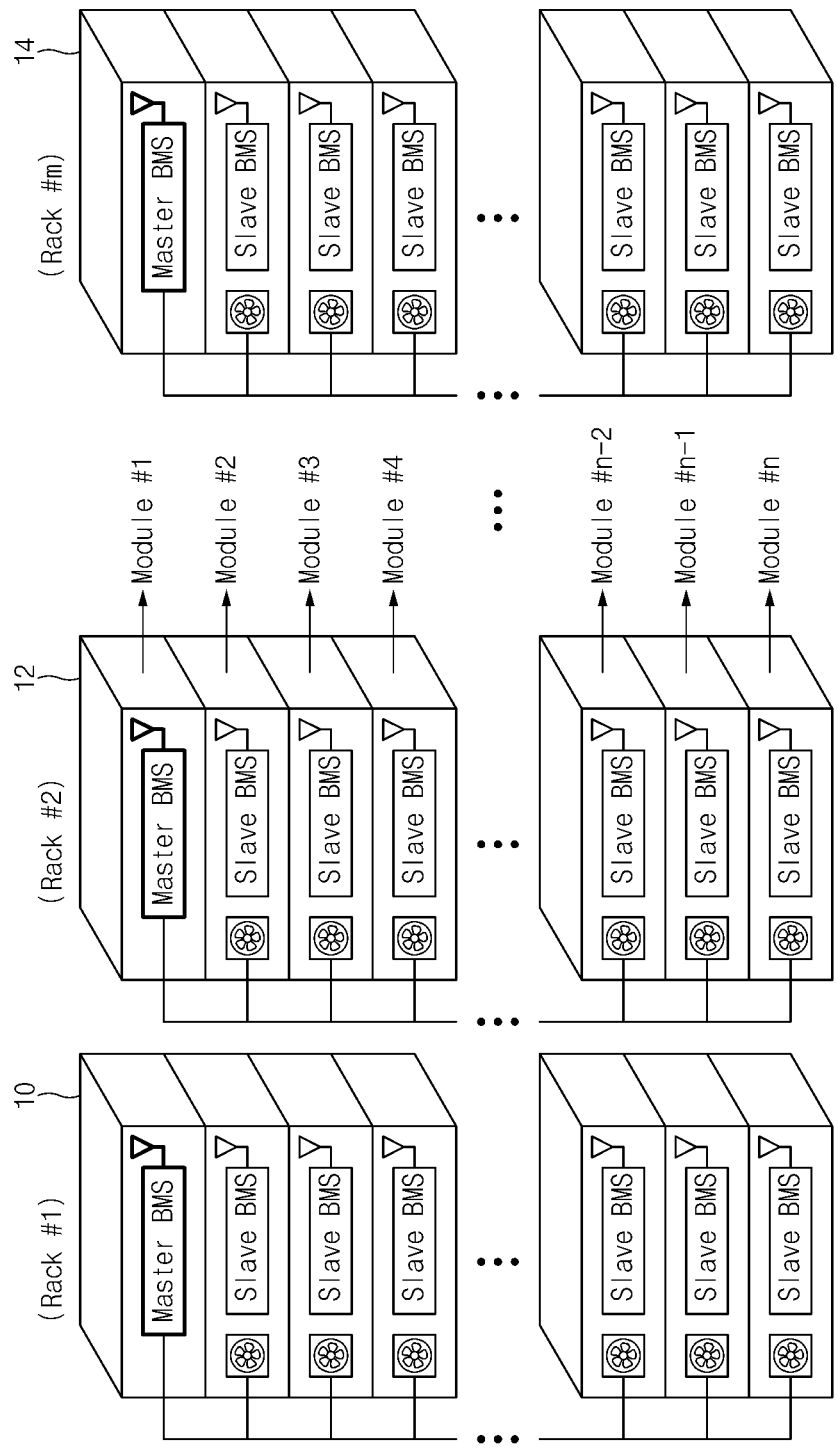
FIG. 1 schematically illustrates a configuration of a plurality of battery racks in an ESS in relation to an embodiment of the present invention.

Hereinafter, various embodiments of the present invention are disclosed with reference to the accompanying drawings. However, this is not intended to limit the invention to the specific embodiments, and it is to be understood that the invention includes various modifications, equivalents, and/or alternatives. With respect to the descriptions of the drawings, like reference numerals refer to like elements.

Terms used herein is for the purpose of describing particular example embodiments only and is not intended to be limiting of the scope of other embodiments. The terms of a singular form may include plural forms unless they have a clearly different meaning in the context. Otherwise indicated herein, all the terms used herein, which include technical or scientific terms, may have the same meaning that is generally understood by a person skilled in the art. In general, the terms defined in the dictionary should be considered to have the same meaning as the contextual meaning of the related art, and, unless clearly defined herein, should not be understood as having an ideal or excessively formal meaning. In any cases, even the terms defined in this specification cannot be interpreted as excluding embodiments of the present invention.

In addition, in describing the components of the embodiment of the present invention, terms such as first, second, A, B, (a), and (b) may be used. These terms are only to distinguish the components from other components, and the nature, sequence, or order of the components are not limited by the terms. In addition, when a component is described as being "connected to", "coupled to" or "linked to" another component, the components may be directly connected to or linked to each other, but it should be understood that other components may be "connected", "coupled", or "linked" between each component.

FIG. 1 schematically shows the configuration of a plurality of battery racks 10 to 14 in an ESS according to an embodiment of the present invention.

The ESS includes a plurality of battery racks. Each battery rack includes a plurality of battery modules connected in series or parallel. Each battery module is monitored and controlled by each slave BMS. In addition, each battery module is provided with a fan for cooling the heat generated in the battery module.

When a plurality of battery racks are included in one ESS in this way and when communicating wirelessly between the master BMS and the slave BMS in the battery rack, since wireless communication can be performed between a master BMS in a corresponding battery rack and a slave BMS in another battery rack, after the ESS is initially installed, it is difficult for each master BMS to identify the slave BMS located in the same battery rack. Therefore, in the related art, when initially installing the ESS, the installer had to manually input ID information to each slave BMS or install the modules in a predetermined order. In this case, there was a problem that a mistake may occur in the installation process, and it may take more time to install. A configuration for automatically allocating an ID to a slave BMS by a master BMS according to an embodiment of the present invention for solving this problem will be described later.

Figure 2:
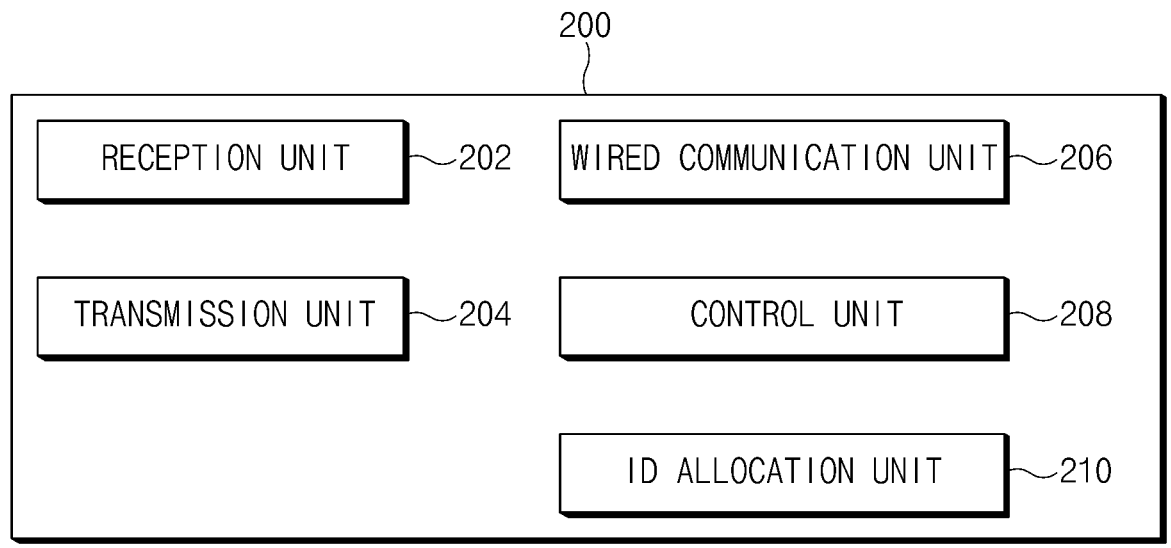
FIG. 2 is a block diagram of a master BMS that automatically allocates an ID to an associated slave BMS according to an embodiment of the present invention.

FIG. 2 is a block diagram of a master BMS 200 that automatically allocates an ID to an associated slave BMS according to an embodiment of the present invention.

The master BMS 200 includes a reception unit 202, a transmission unit 204, a wired communication unit 206, a control unit 208, and an ID allocation unit 210.

The reception unit 202 receives an association signal from a plurality of slave BMSs. In this regard, a plurality of slave BMSs receive a cell balancing command signal from the master BMS 200. Each slave BMS performs cell balancing only when the strength of the received cell balancing command signal is greater than a preset strength. The temperature inside the PCB of the slave BMS, which has performed cell balancing, rises. After a certain period of time starts after cell balancing, each slave BMS measures the temperature of the PCB board of the corresponding slave BMS. Subsequently, at least one slave BMS in the same rack as the corresponding master BMS 200 among the plurality of slave BMSs receives a fan on signal from the master BMS 200 by wire. At least one slave BMS in the same rack as the corresponding master BMS 200 among the plurality of slave BMSs that have performed cell balancing drives a fan and measures the PCB temperature of the slave BMS after a certain period of time.

In addition, the reception unit 202 receives a received signal strength indication (RSSI) level indicating a reception strength for a specific signal transmitted by the master BMS, for example, signal S3, from each associated slave BMS. The associated slave BMS is a slave BMS where the difference between the temperature after cell balancing and the temperature after fan driving is greater than the difference between the preset temperatures among the plurality of slave BMSs that transmit the difference between the temperature after cell balancing and the temperature after fan driving to the master BMS, and means a slave BMS determined to be located in the same rack as the corresponding master BMS.

The associated slave BMS receiving the signal S3 from the master BMS detects the RSSI level for the reception strength of each received signal S3 and transmits the value to the master BMS.

In addition, the reception unit 202 receives the RSSI level indicating the reception strength for a specific signal, for example, signal S4, received from the slave BMS to which the ID is allocated in the last order, from the associated slave BMS, except for the slave BMS that has already been allocated an ID.

The transmission unit 204 transmits a cell balancing start command signal to a plurality of slave BMSs. Also, the transmission unit 204 transmits a temperature measurement command signal to a plurality of slave BMSs.

In addition, the transmission unit 204 transmits a specific signal, for example, signal S3, to the associated slave BMS. At this time, the master BMS 200 determines that the slave BMS, in which the difference between the slave PCB temperature measured after performing cell balancing and the slave PCB temperature measured after fan driving is greater than a preset temperature difference, each received from a plurality of slave BMSs, is a slave BMS in the same battery rack as the corresponding master BMS, and refers this slave BMS as an associated slave BMS.

The transmission unit 204 transmits ID allocation information to the master BMS or the slave BMS having the highest RSSI level of the signal received from the last BMS allocated with the ID.

The wired communication unit 206 transmits a fan ON signal to a slave BMS in which the corresponding master BMS and the fan are wired. Specifically, among a plurality of slave BMSs that perform cell balancing by wirelessly receiving a cell balancing signal from the master BMS 200, only the slave BMS in which the fan is wired to the corresponding master BMS 200 receives a fan on signal from the corresponding master BMS 200 to perform a fan on operation.

The control unit 208 sets a fan ID and a communication channel of at least one slave BMS that has transmitted an association signal by changing it from a default value to a specific value.

The ID allocation unit 210 allocates IDs, which are the next order of previously allocated IDs, to the slave BMS that has transmitted the highest level of RSSI levels received from a plurality of slave BMSs. For example, when the ID is allocated for the first time, the ID allocation unit allocates the #1 slave BMS as the corresponding slave BMS. In addition, for example, after allocating the ID of the #3 slave BMS, the ID allocation unit may allocate the #4 slave BMS as the slave BMS that has transmitted the highest level of the RSSI levels received from the plurality of slave BMSs. Here, the ID number does not necessarily have to be an Arabic numeral having a regular interval, and any value can be used as long as the sequence can be identified.

Figure 3:
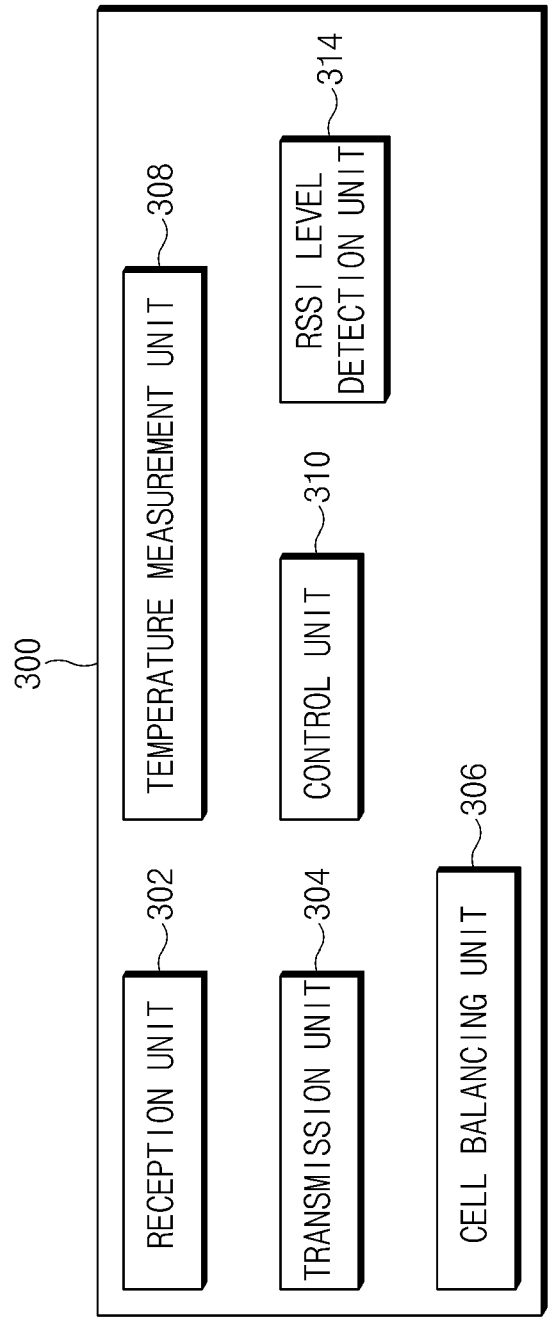
FIG. 3 is a schematic block diagram of a slave BMS according to an embodiment of the present invention.

FIG. 3 is a block diagram of a slave BMS 300 in which IDs are automatically allocated to associated slave BMSs according to an embodiment of the present invention.

The slave BMS 300 includes a reception unit 302, a transmission unit 304, a cell balancing unit 306, a temperature measurement unit 308, a control unit 310, and an RSSI level detection unit 314.

The reception unit 302 wirelessly receives a cell balancing start command signal from the master BMS 200.

In addition, the reception unit 302 receives a specific signal, for example signal S3, from the master BMS 200 or another slave BMS. Only when the difference between the temperature of the PCB substrate measured after the cell balancing unit 306 performs cell balancing by receiving the cell balancing start command signal and the temperature of the PCB substrate measured after the fan is driven is greater than a preset value, the signal S3 is received from the master BMS 200.

In addition, the reception unit 302 receives ID information allocated from the master BMS 200.

When the difference between the PCB temperature measured after cell balancing with the master BMS and the measured PCB temperature after fan driving is greater than the preset value, the transmission unit 304 transmits an association signal.

In addition, the transmission unit 304 transmits a specific signal received from the master BMS or other slave BMS, for example, the RSSI level value for the reception strength of the signal S3 or S4, to the master BMS.

When the strength of the cell balancing start signal received from the master BMS is greater than a preset strength value, the cell balancing unit 306 performs battery cell balancing in a battery module controlled by the corresponding slave BMS.

The temperature measurement unit 308 receives a cell balancing start command signal from the master BMS, and after the cell balancing unit starts cell balancing and a certain time has elapsed, measures the temperature of the PCB board of the corresponding slave BMS.

In addition, the temperature measurement unit 308 receives a fan on signal from the master BMS and measures the temperature of the PCB board of the corresponding slave BMS after a certain period of time has elapsed after the fan driving unit 300 drives the fan.

The control unit 310 calculates the difference between the temperature of the PCB substrate of the slave BMS measured after cell balancing measured by the temperature measurement unit 308 and the temperature of the PCB substrate of the slave BMS measured after fan driving to allow the transmission unit 304 to transmit the difference to the master BMS.

In addition, when the corresponding slave BMS is an associated slave BMS, the control unit 310 changes the fan ID and communication channel to a specific value by the master BMS.

In addition, when the ID is allocated from the master BMS, the control unit 310 allows the transmission unit 304 to transmit a specific signal to another slave BMS.

When the RSSI level detection unit 314 receives a specific signal from the master BMS or another slave BMS, for example, the signals S3 or S4, the RSSI level detection unit detects the reception strength of the corresponding signals as the RSSI level. The RSSI level detected by the RSSI level detection unit 314 is transmitted to the master BMS.

Figure 4A:
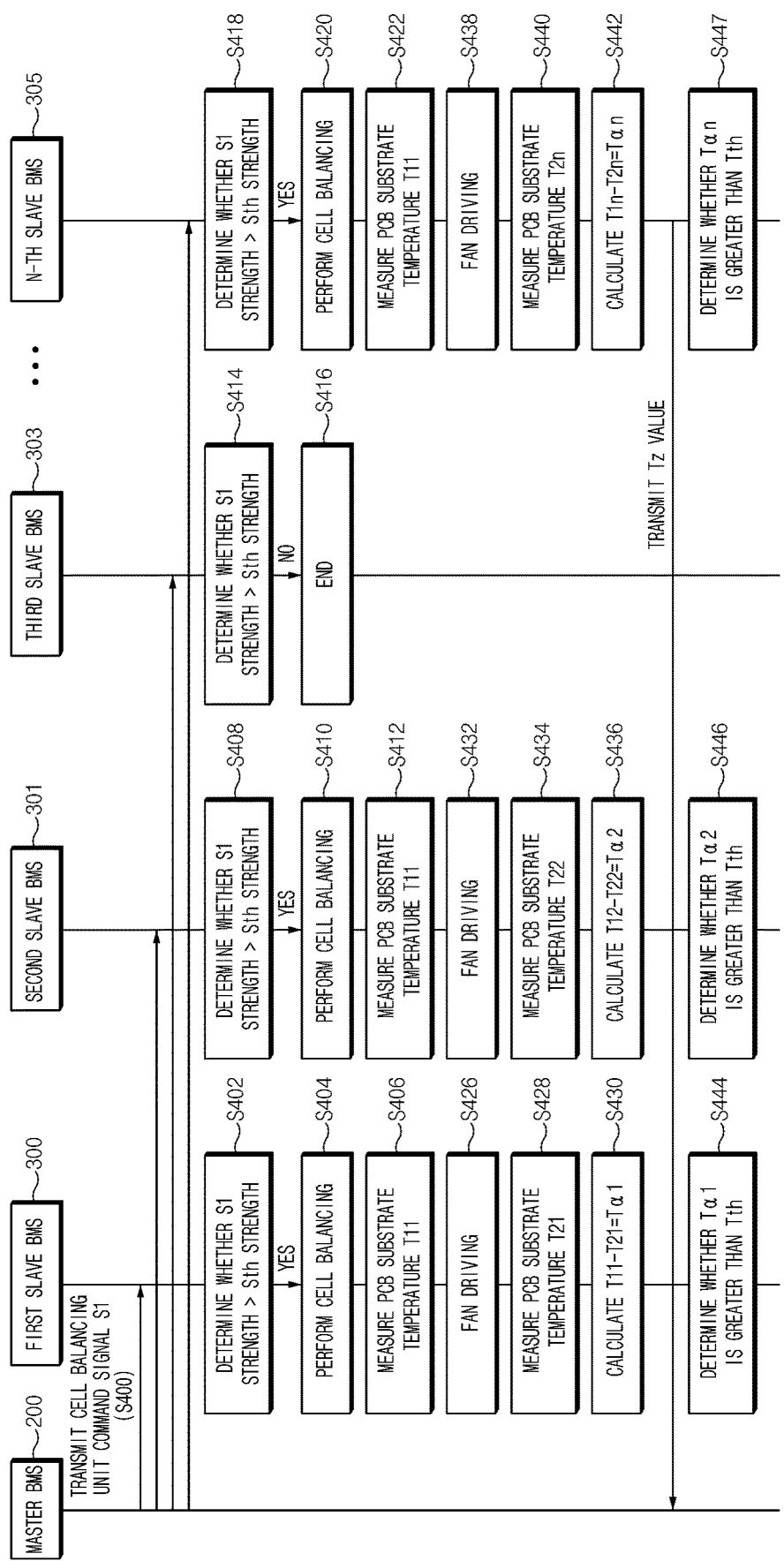
FIGS. 4A and 4B are schematic flowcharts of a method for automatically allocating IDs to associated slave BMSs according to an embodiment of the present invention.
Figure 4B:
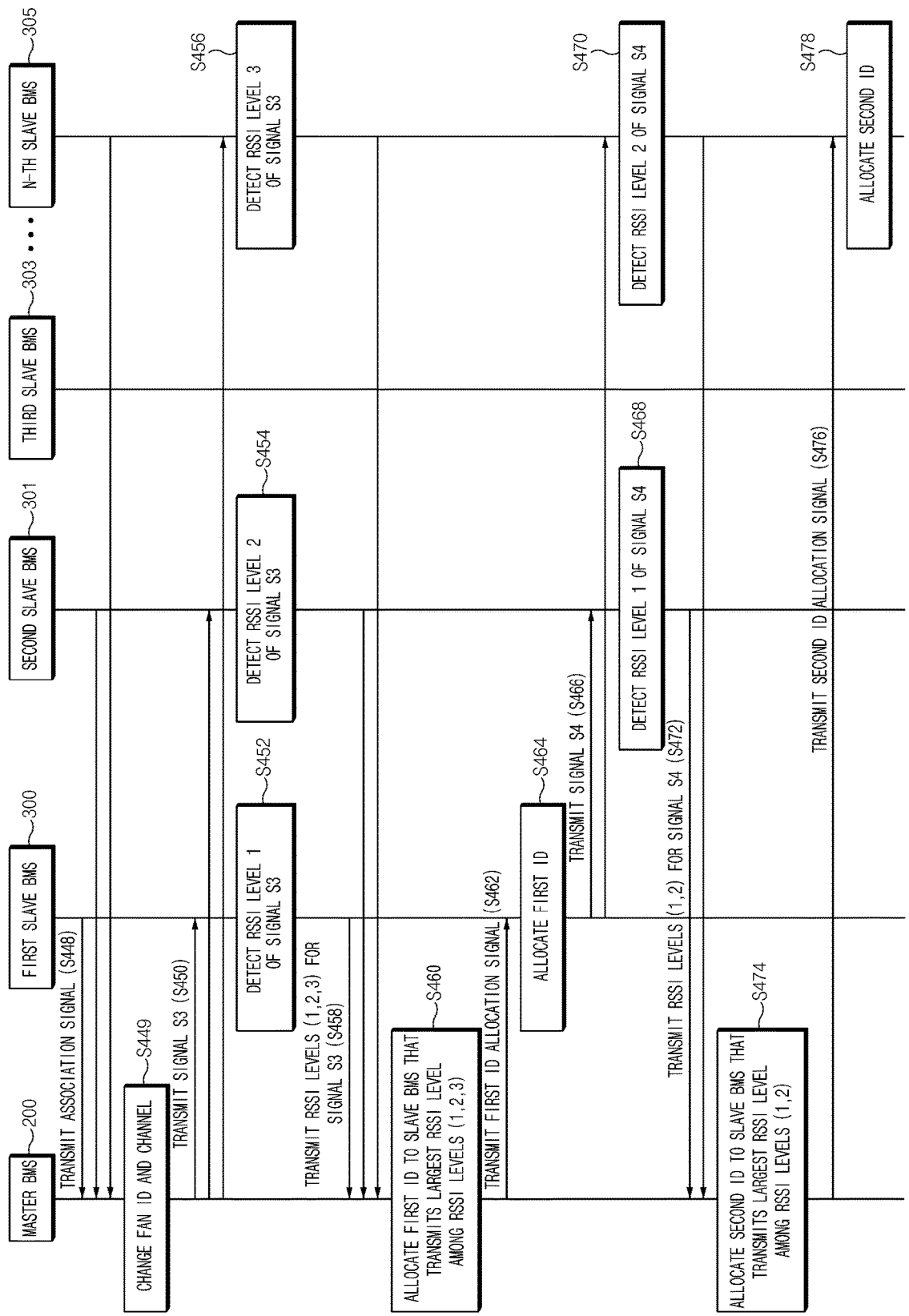

FIGS. 4A and 4B are schematic flowcharts of a method for automatically allocating IDs to associated slave BMSs according to an embodiment of the present invention.

The master BMS 200 wirelessly transmits a cell balancing start command signal S1 to the first to n-th slave BMSs 300, 301, 303, and 305 (S400).

The first slave BMS 300 determines whether the strength of the signal S1 from the master BMS 200 is greater than the strength value of the preset signal Sth (S402). The first slave BMS 300 performs cell balancing when the strength of the signal S1 from the master BMS 200 is greater than the strength value of the preset signal (S404).

The second slave BMS 301 determines whether the strength of the signal S1 from the master BMS 200 is greater than the strength value Sth of the preset signal (S408). The second slave BMS 301 performs cell balancing when the strength of the signal S1 from the master BMS 200 is greater than the strength value of the preset signal (S410).

The third slave BMS 303 determines whether the strength of the signal S1 from the master BMS 200 is greater than the strength value of the preset signal (S414). The third slave BMS 303 does not perform an operation after cell balancing if the strength of the signal S1 from the master BMS 200 is less than the strength value of the preset signal (S416).

The n-th slave BMS 305 determines whether the strength of the signal S1 from the master BMS 200 is greater than the strength value of the preset signal (S418). The n-th slave BMS 305 performs cell balancing when the strength of the signal S1 from the master BMS 200 is greater than the strength value of the preset signal (S420).

The first slave BMS 300 performs cell balancing and measures the temperature T11 of the PCB substrate of the slave BMS after a certain period of time (or after receiving a temperature measurement command from the master BMS 200) (S406). The second slave BMS 301 performs cell balancing and measures the temperature T12 of the PCB substrate of the slave BMS after a certain time (S412). The n-th slave BMS 305 performs cell balancing and measures the temperature T1n of the PCB substrate of the slave BMS after a certain time (S422).

Subsequently, the master BMS 200 drives a fan attached to the slave BMS in the same battery rack. Accordingly, fans respectively installed in the first, second, and n-th slave BMSs 300, 301, and 305 perform fan driving (S426), (S432) and (S438).

After a certain period of time after fan driving (or after receiving a temperature measurement command from the master BMS), the first slave BMS 300 measures the temperature T21 of the PCB substrate (S428). As a certain period of time elapses after fan driving, the second slave BMS 301 measures the temperature T22 of the PCB substrate (S434). As a certain period of time elapses after fan driving, the n-th slave BMS 305 measures the temperature T2n of the PCB substrate (S440).

Subsequently, the first slave BMS 300 calculates a difference Tα1 between the PCB measurement temperature T11 after cell balancing and the PCB measurement temperature T21 after fan driving (S430). In addition, the second slave BMS 301 calculates a difference Tα2 between the PCB measurement temperature T12 after cell balancing and the PCB measurement temperature T22 after fan driving (S436). In addition, the n-th slave BMS 305 calculates a difference value Tαn between the PCB measurement temperature T1n after cell balancing and the PCB measurement temperature T2n after fan driving (S442).

The first slave BMS 300 determines whether Tα1 is greater than a preset Tth value (S444). The second slave BMS 301 determines whether Tα2 is greater than a preset Tth value (S446). The n-th slave BMS 305 determines whether Tαn is greater than a preset Tth value (S447).

Each of the slave BMSs 300, 301, and 305 transmits an association signal to the master BMS 200 when the values of Tα1, Tα2, and Tαn are greater than a preset Tth value (S448). In operation S400, S448 is repeated until the number of association signals received by the master BMS is equal to a preset number (e.g., the number of slave BMSs determined to be in the same rack as the corresponding master BMS).

The master BMS 200 receiving the association signal from at least one slave BMS sets the fan ID of the slave BMS that transmitted the association signal and the communication channel with the corresponding slave BMS from a default value to a specific value (S449).

Thereafter, the master BMS 200 transmits a specific signal, for example, a signal S3, to the first slave BMS 300, the second slave BMS 301, and the n-th slave BMS 305 (S450).

The first slave BMS 300 receives the signal S3 from the master BMS 200 and detects the RSSI level 1 of the corresponding signal S3 (S452). The second slave BMS 301 receives the signal S3 from the master BMS 200 and detects the RSSI level 2 of the signal S3 (S454). The n-th slave BMS 305 receives the signal S3 from the master BMS 200 and detects the RSSI level 3 of the corresponding signal S3 (S456).

The first slave BMS 300 transmits the RSSI level 1 to the master BMS 200 as a packet. The second slave BMS 301 transmits the RSSI level 2 as a packet to the master BMS 200. The n-th slave BMS 305 transmits the RSSI level 3 as a packet to the master BMS 200 (S458).

The master BMS 200 identifies the slave BMS that has transmitted the largest RSSI level among the sizes of the RSSI level 1, the RSSI level 2, and the RSSI level 3 received from the first slave BMS 300, the second slave BMS 301, and the nth slave BMS 305, respectively, and allocates the first ID to the corresponding slave BMS (S460).

In this example, for example, when assuming that the RSSI level 1 is the largest level, the master BMS 200 transmits a first ID allocation signal to the first slave BMS 300 (S462).

The first slave BMS 300 receiving the first ID allocation signal from the master BMS 200 sets its ID to the first ID (S464).

After the first slave BMS 300 is allocated with the first ID, the first slave BMS 300 transmits a specific signal, for example, a signal S4, to another slave BMS (S466).

The second slave BMS 301 receiving the signal S4 from the first slave BMS 300 detects the RSSI level 1 of the signal S4 (S468). The n-th slave BMS 305 receiving the signal S4 from the first slave BMS 300 detects the RSSI level 2 of the signal S4 (S470).

The second slave BMS 301 transmits the RSSI level 1 as a packet to the master BMS 200, and the nth slave BMS 305 also transmits the RSSI level 2 as a packet to the master BMS 200 (S472).

By identifying the slave BMS transmitting the largest level of the RSSI level 1 and level 2 received from the second slave BMS 301 and the n-th slave BMS 305, respectively, a second ID is allocated (S474). In this example, it is assumed that level 2 is greater than level 1. Accordingly, the master BMS 200 transmits a second ID allocation signal to the n-th slave BMS 305 (S476). The n-th slave BMS 305 receiving the second ID allocation signal from the master BMS 200 allocates the second ID by itself (S478).

Subsequently, the n-th slave BMS 305 repeats the above sequence by transmitting a specific signal to another associated slave BMS to which an ID is not allocated, and when ID is allocated to all associated slave BMS, ID allocation for the slave BMS in the battery rack ends.

Figure 5A:
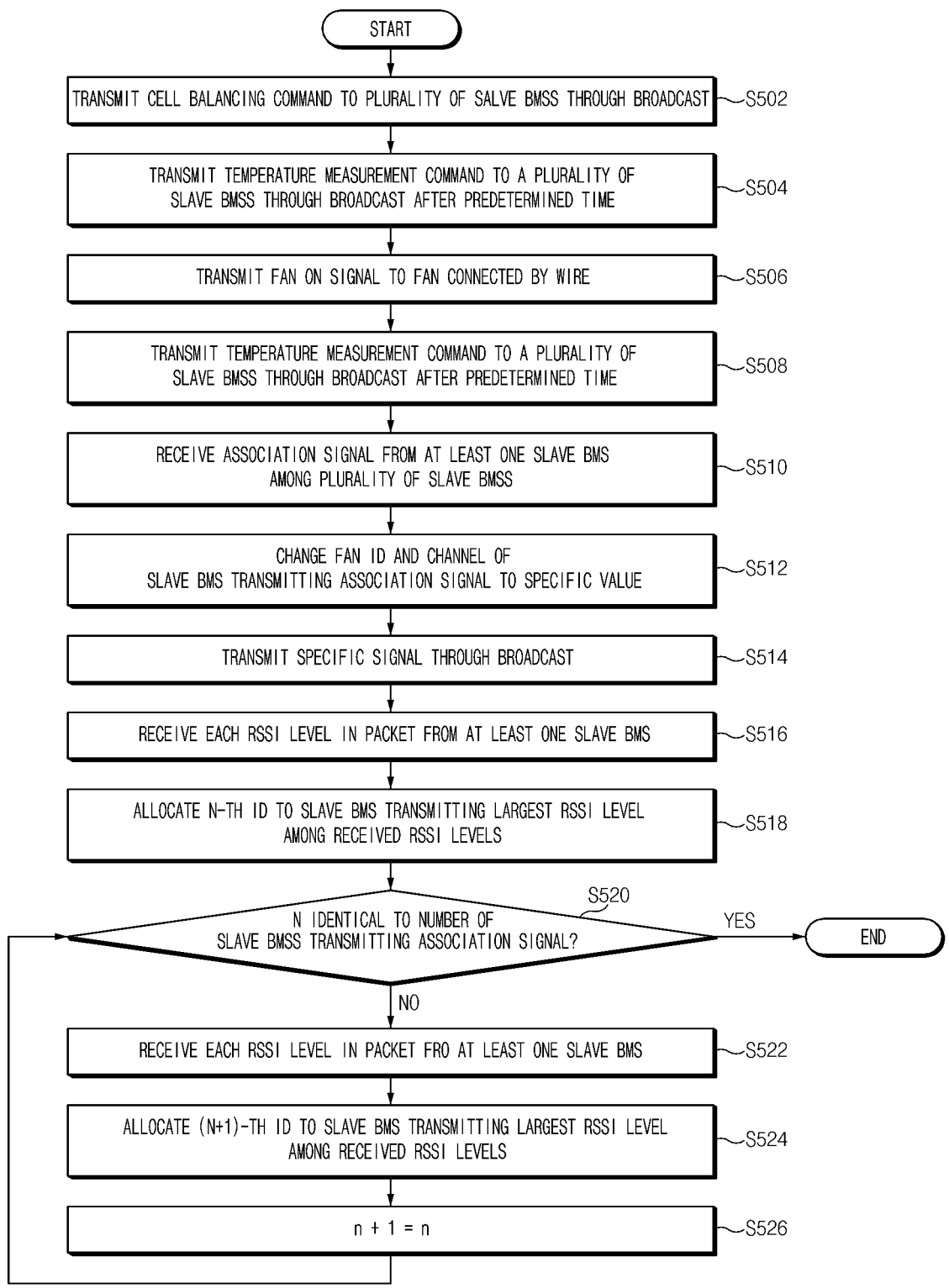
FIG. 5A is a flowchart for the operation of a master BMS according to an embodiment of the present invention.

FIG. 5A is a flowchart for the operation of a master BMS according to an embodiment of the present invention.

The master BMS 200 transmits a cell balancing command by broadcasting to a plurality of slave BMSs 300 to 305 (S502). The master BMS transmits a temperature measurement command signal by broadcasting to a plurality of slave BMSs 300 to 305 after a certain time has elapsed (S504). This is to measure the elevated temperature since the temperature of the PCB board of the slave BMS rises after a certain period of time after the slave BMS starts cell balancing by receiving the cell balancing command.

Subsequently, the master BMS 200 transmits a fan on signal to each of a plurality of fans connected by wire in the same battery rack (S506). The plurality of fans are respectively disposed in a plurality of battery modules located in the same battery rack as the corresponding master BMS 200. When the master BMS 200 transmits fan on signals to a plurality of fans connected to each other by wires in the same battery rack, and each fan operates, the effect is that the temperature of the PCB board of the slave BMS in the same battery rack as the corresponding master BMS is lowered.

Subsequently, after a certain period of time has elapsed again, the master BMS 200 transmits a temperature measurement command to the plurality of slave BMSs 300 to 305 (S508).

After performing cell balancing, the corresponding master BMS and the fan are connected by wire, so the temperature of the PCB board of the slave BMS, which has driven the fan by receiving the fan on signal, will rise and fall, and after performing cell balancing, since the corresponding master BMS and the fan are not wired, the fan on signal is not received, so the PCB board temperature of the slave BMS of the battery module that does not drive the fan will rise and will hardly decrease.

Therefore, it can be seen that the battery module, in which the difference between the temperature of the PCB board of the slave BMS measured after cell balancing and the temperature of the PCB board of the slave BMS measured after fan-on driving is equal to or higher than a certain temperature value, is located in the same rack as the corresponding master BMS.

Subsequently, the slave BMS, in which the difference between the measured temperature after performing cell balancing and the measured temperature after driving the fan on is equal to or greater than a predetermined temperature value, transmits an association signal to the corresponding master BMS.

Accordingly, the master BMS 200 receives an association signal from at least one slave BMS (S510).

Upon receiving the association signal, the master BMS 200 changes the fan ID and channel of each of the at least one slave BMS transmitting the association signal to a specific value (S512). The master BMS 200 determines that the slave BMS transmitting the association signal is an associated slave BMS in the same rack. Therefore, wireless communication is set later by changing a communication channel with an associated slave BMS from a default value to a specific value in order to communicate with the associated slave BMS.

Accordingly, the master BMS 200 transmits a specific signal S3 as a broadcast to a plurality of slave BMSs through the changed communication channel (S514).

The slave BMS receiving the specific signal S3 from the master BMS 200 measures the RSSI level of the received signal S3 (S516). The slave BMS transmits the RSSI level measured by the master BMS in packets.

Subsequently, the master BMS 200 allocates an n-th ID to the slave BMS that has transmitted the largest RSSI level among the RSSI levels received from at least one slave BMS (S518). Here, n is a natural number, the first ID may start from 1, and any character, number, or special symbol that indicates the sequence can be used.

The master BMS 200 determines whether n matches the number of slave BMSs that have transmitted the association signal (S520).

If they do not match, RSSI levels are received in packets from at least one associated slave BMS, except for the slave BMS that is allocated with the ID in the previous operation after a certain time (S522).

The master BMS allocates an (n+1)-th ID to the slave BMS that has transmitted the largest RSSI level among the received RSSI levels (S524). Thereafter, it is determined whether n+1 matches the number of slave BMSs transmitted as n (S526).

The master BMS ends the ID allocation operation when n matches the number of slave BMSs that have transmitted the association signal.

Figure 5B:
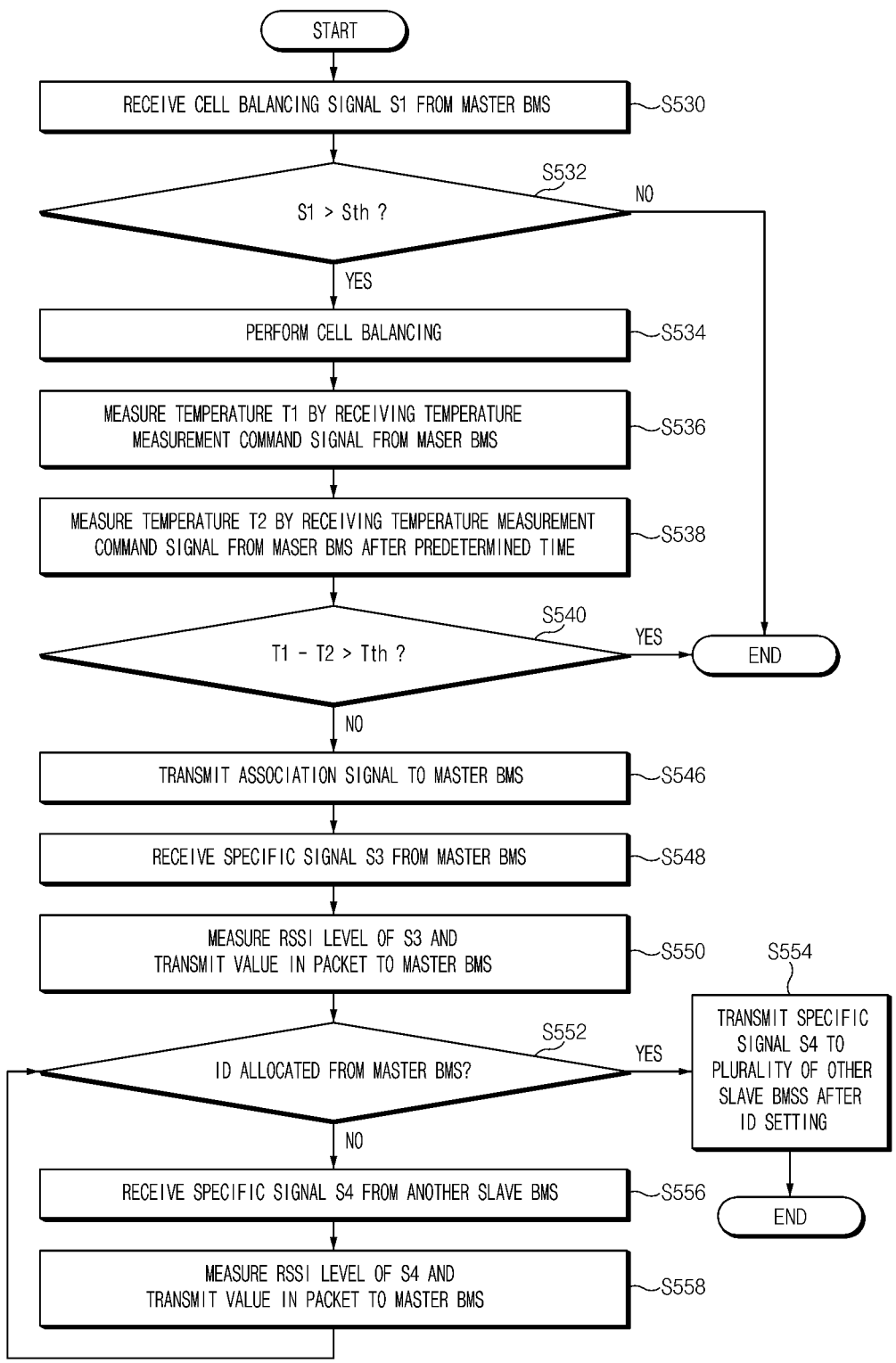
FIG. 5B is a flowchart for the operation of a slave BMS according to an embodiment of the present invention.

FIG. 5B is a flowchart for the operation of a slave BMS according to an embodiment of the present invention.

The slave BMS wirelessly receives the cell balancing command signal S1 from the master BMS 200 (S530).

The slave BMS receiving the cell balancing command signal S1 determines whether the signal S1 is greater than a predetermined signal strength Sth (S532).

The slave BMS performs cell balancing when the received cell balancing command signal S1 is greater than the strength value of the preset signal Sth (S534). The slave BMS does not perform cell balancing when the received cell balancing command signal S1 is smaller than the strength value of the preset signal Sth. Here, the strength of the preset signal Sth is set to a value such that when the master BMS transmits the signal S1, the farthest slave BMS among the slave BMSs in the same rack as the corresponding master BMS performs cell balancing, and the slave BMS that is farther than the farthest slave BMS do not perform cell balancing.

After the slave BMS performs cell balancing, the temperature of the PCB substrate of the slave BMS increases. If the temperature of the cell balancing circuit rises, it will affect the temperature of the entire battery module. Thus, the slave BMS receiving the temperature measurement command signal from the master BMS measures the temperature T1 of the PCB substrate of the slave BMS raised by cell balancing (S536).

In addition, the fan installed in the battery module where the corresponding slave BMS is located is wired to the master BMS located in the same rack, and is controlled by the master BMS. Therefore, after the master BMS provides a temperature measurement command, when a driving signal is transmitted to a fan installed in each of the plurality of slave BMSs in the same rack, fan driving starts.

Subsequently, the master BMS wirelessly transmits a temperature measurement command to a plurality of slave BMSs.

After a certain time, the slave BMS receiving the temperature measurement command from the master BMS measures the lowered temperature T2 of the PCB substrate of the slave BMS after fan driving (S538).

The slave BMS determines whether the difference between the temperature T1 measured after cell balancing and the temperature T2 measured after fan driving is greater than a preset temperature difference Tth (S540).

If the difference between the temperature T1 measured after cell balancing and the temperature T2 measured after fan driving is smaller than the preset temperature difference Tth, the slave BMS completes the corresponding process without setting the ID without further operation.

Meanwhile, if the difference between the temperature T1 measured after cell balancing and the temperature T2 measured after fan driving is greater than a preset temperature difference Tth, the slave BMS transmits an association signal to the master BMS (S546). The master BMS 200 receiving the association signal from at least one slave BMS sets the fan ID and communication channel of the slave BMS that has transmitted the association signal by changing from a default value to a specific value (S449).

Thereafter, the slave BMS receives a specific signal S3 from the master BMS (S548). The slave BMS wirelessly receives a specific signal S3 by broadcast from the master BMS.

The slave BMS receiving the specific signal S3 measures the RSSI level of the received specific signal S3 and transmits the value as a packet to the master BMS 200 (S550).

After transmitting the RSSI level to the master BMS 200, the slave BMS determines whether an ID allocation signal is received from the master BMS 200 (S552). When the slave BMS receives an ID allocation signal from the master BMS 200, it sets an ID and transmits a specific signal S4 to a plurality of other slave BMSs (S554).

Even after a predetermined time, the corresponding slave BMS may receive a specific signal S4 from another slave BMS when it does not receive the ID allocation signal from the master BMS 200 (S556).

The slave BMS measures the RSSI level of the received signal S4 and transmits the value as a packet to the master BMS (S558). After transmitting the RSSI level, the slave BMS determines whether to receive the ID allocation signal by the master BMS again, and repeats operations S554 to S558.

Figure 6:
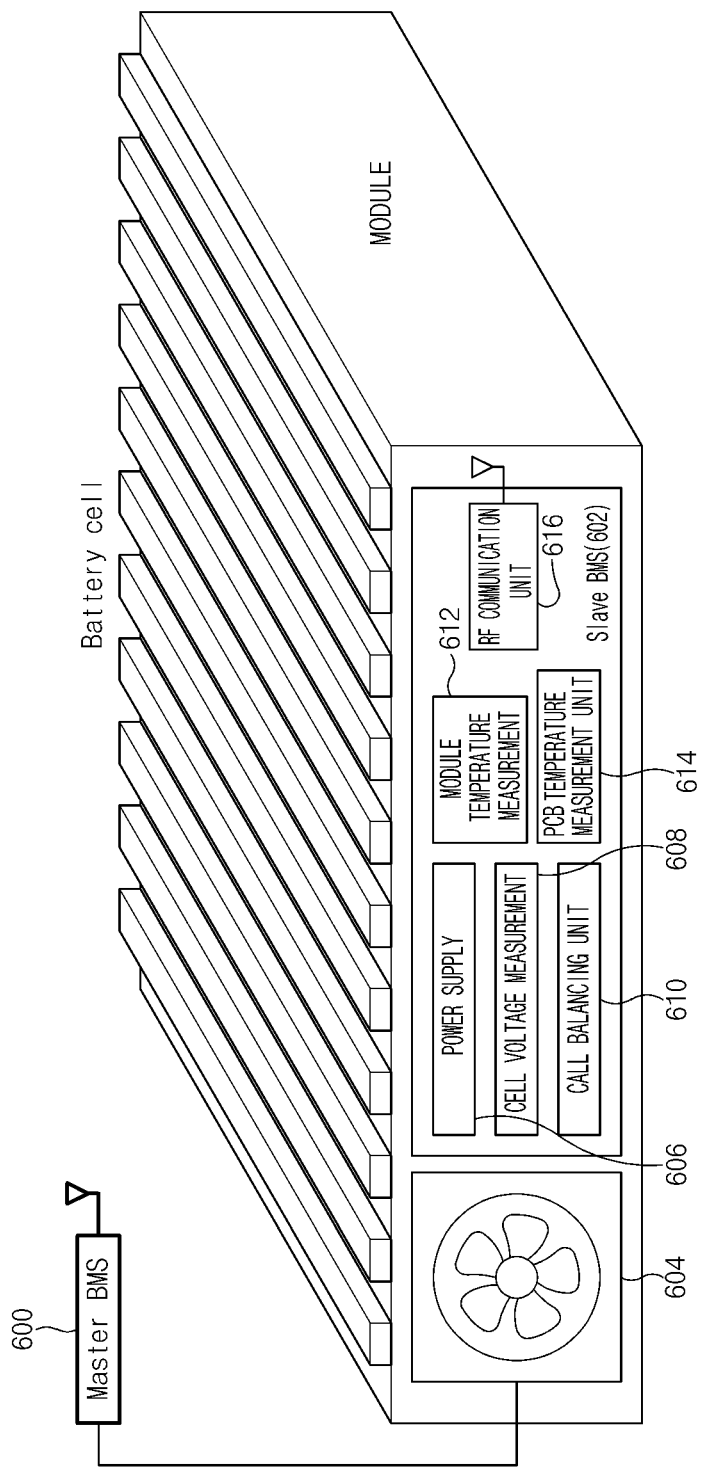
FIG. 6 shows an implementation of a slave BMS according to an embodiment of the present invention.

FIG. 6 shows an implementation of a slave BMS according to an embodiment of the present invention.

The master BMS 600 located in the corresponding battery rack is wired to the fan 604 of the battery module located in the same battery rack. In addition, the PCB substrate of the slave BMS 602 is disposed close to the fan, and when the fan is driven, the temperature of the raised PCB substrate may be lowered.

The slave BMS 602 may include a power unit 606, a battery cell voltage measurement unit 608, a cell balancing unit 610, a module temperature measurement unit 612, a PCB temperature measurement unit 614, and an RF communication unit 616. When the RF communication unit 616 receives the cell balancing signal from the master BMS 600, the cell balancing unit 610 performs battery cell balancing only when the strength of the received cell balancing signal is greater than a preset value. When cell balancing is performed, the temperature of the PCB substrate rises, and the PCB temperature measurement unit 614 measures the elevated temperature. In addition, the fan 604 mounted on the battery module is then driven by the master BMS. When the fan 604 mounted on the battery module is driven, the temperature of the PCB substrate whose temperature is increased by performing cell balancing drops. The PCB temperature measurement unit 614 measures the temperature of the PCB substrate whose temperature is lowered by fan driving. The RF communication unit 616 transmits an association signal to the master BMS when the difference between the measured temperature after cell balancing and the measured temperature after fan driving is equal to or greater than a predetermined value.

If the fan is installed adjacent to the slave BMS, automatic ID allocation of the slave BMS is possible without additional configuration or cost.

Figure 7:
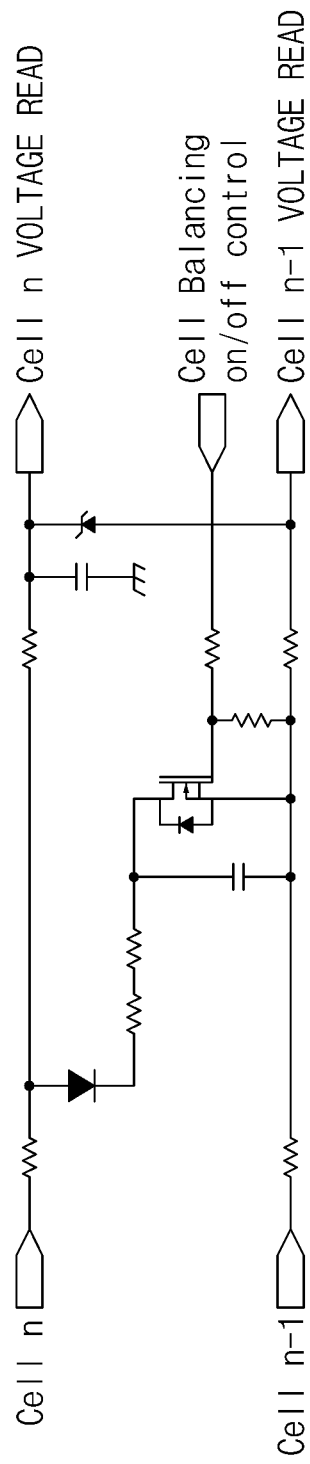
FIG. 7 exemplarily shows a circuit for implementing cell balancing between battery cells according to an embodiment of the present invention.

FIG. 7 exemplarily shows a circuit for implementing cell balancing between battery cells according to an embodiment of the present invention.

The cell balancing implementation circuit shown in FIG. 7 is an example, and any circuit may be used as long as it can implement cell balancing.

Reference herein to 'one embodiment' of the principles of the present invention and various modifications of such expressions means that, in relation to this embodiment, the specific features, structures, characteristics, and the like are included in at least one embodiment of the principles of the present invention. Thus, the expression 'in one embodiment' and any other modifications disclosed throughout the specification are not necessarily all referring to the same embodiment.

All the embodiments and conditional examples disclosed in this specification are described to intend to help those skilled in the art to understand the principles and concepts of the present invention, so that it will be understood by those skilled in the art that various changes in form and details may be made therein without departing from the spirit and scope of the present invention. Therefore, the disclosed embodiments should be considered in descriptive sense only not in limited perspective sense. The scope of the invention is defined not by the detailed description of the invention but by the appended claims, and all differences within the scope will be construed as being included in the present invention.

The invention claimed is:

1. A master battery management system (BMS), comprising:
    a transmission unit configured to wirelessly transmit a cell balancing start command signal and a temperature measurement command signal at least two times to a plurality of slave BMSs;
    a wired communication unit configured to transmit a FAN ON signal to a plurality of fans connected together after the transmission unit wirelessly transmits the cell balancing start command signal;
    a reception unit configured to receive an association signal from an associated slave BMS, that is a slave BMS among the plurality of slave BMSs, having a difference value between a temperature of a printed circuit board (PCB) board of a corresponding slave BMS measured based on the temperature measurement command signal transmitted immediately after the cell balancing start command signal and a temperature of a PCB substrate of a corresponding slave BMS measured based on the temperature measurement command signal transmitted after the FAN ON signal transmission greater than a preset value; and
    a control unit configured to determine that the associated slave BMS is disposed in the same rack, and change an ID and communication channel of the associated slave BMS to a specific value.

2. The master BMS of claim 1, wherein the transmission unit transmits a signal for signal strength measurement to a plurality of associated slave BMSs,
    wherein the reception unit receives a Received Signal Strength Indication (RSSI) level for a reception strength of the signal strength measurement signal received by a corresponding associated slave BMS from each of the plurality of associated slave BMSs.

3. The master BMS of claim 2, further comprising an ID allocation unit configured to allocate a n-th ID (n is a natural number) to a first associated slave BMS among the plurality of associated BMSs that transmits the largest RSSI level based on the RSSI level received from each of the plurality of associated slave BMSs.

4. The master BMS of claim 3, wherein after allocating the n-th ID, the reception unit receives the RSSI level for the reception strength of the signal strength measurement signal received from the associated slave BMS to which the n-th ID is allocated by a plurality of associated slave BMSs except for the associated slave BMS to which the ID is allocated by the ID allocation unit,
    wherein the ID allocation unit allocates an (n+1)-th ID to an associated slave BMS transmitting the largest RSSI level based on the RSSI level received from each of the plurality of associated slave BMSs except for the associated slave BMS to which the ID is allocated.

5. The master BMS of claim 4, wherein the control unit allows the ID allocation unit to repeat the ID allocation operation until n+1, which is the number of IDs allocated by the ID allocation unit, is equal to the number of associated slave BMSs transmitting the association signal.

6. The master BMS of claim 1, wherein the master BMS transmits the cell balancing start command signal and the temperature measurement command signal in a broadcast manner.

7. A slave BMS comprising:
    a reception unit configured to wirelessly receive a cell balancing start command signal and a temperature measurement command signal at least two times from a predetermined master BMS;

a cell balancing unit configured to perform cell balancing when a strength of the cell balancing start command signal is greater than a preset strength;

a temperature measurement unit configured to measure a temperature of a PCB substrate a plurality of times based on the temperature measurement command signal of the at least two times; and a transmission unit configured to transmit an association signal to the master BMS when a difference between a first temperature and a second temperature, which are temperatures of the battery module measured based on the temperature measurement command signal of the at least two times, is greater than a preset value.

8. The slave BMS of claim 7, wherein when the association signal is transmitted, the reception unit receives a signal for signal strength measurement, wherein the slave BMS further comprises an RSSI level detection unit configured to detect an RSSI level for strength of the signal for the signal strength measurement, wherein the transmission unit transmits the detected RSSI level to the master BMS.

9. The slave BMS of claim 8, wherein the reception unit receives ID allocation information from the master BMS, wherein the slave BMS further comprises a control unit configured to generate a signal for signal strength measurement to allows the transmission unit to transmit the signal for signal strength measurement to at least one other associated slave BMS when receiving the ID allocation information.

10. The slave BMS of claim 7, wherein when the strength of the cell balancing start command signal is equal to or less than a preset strength, the master BMS transmitting the cell balancing start command signal determines that the corresponding slave BMS is a master BMS placed in another rack.

11. An automatic ID allocation system of an associated slave battery management system (BMS) in a battery rack where a specific master BMS is disposed, the automatic ID allocation system comprising:

a master BMS comprising:
  a transmission unit configured to wirelessly transmit a cell balancing start command signal and a temperature measurement command signal of at least two times to a plurality of slave BMSs;
  a wired communication unit configured to transmit a FAN ON signal to a plurality of fans connected by wire after the transmission unit wirelessly transmits the cell balancing start command signal;
  a reception unit configured to receive an association signal from an associated slave BMS that is a slave BMS in which a difference value between a temperature of a printed circuit board (PCB) board of a corresponding slave BMS measured based on the temperature measurement command signal transmitted immediately after the cell balancing start command signal and a temperature of a PCB substrate of a corresponding slave BMS measured based on the temperature measurement command signal transmitted after the FAN ON signal transmission among the plurality of slave BMSs is greater than a preset value; and
  a control unit configured to determine that the associated slave BMS is disposed in the same rack, and change an ID and communication channel of the associated slave BMS to a specific value; and a slave BMS comprising:
  a reception unit configured to wirelessly receive a cell balancing start command signal and a temperature measurement command signal at least two times from a predetermined master BMS;
  a cell balancing unit configured to perform cell balancing when a strength of the cell balancing start command signal is greater than a preset strength;
  a temperature measurement unit configured to measure a temperature of a PCB substrate a plurality of times based on the temperature measurement command signal of the at least two times; and
  a transmission unit configured to transmit an association signal to the master BMS when a difference between a first temperature and a second temperature, which are temperatures of the battery module measured based on the temperature measurement command signal of the at least two times, is greater than a preset value.

12. The automatic ID allocation system of claim 11, wherein when the difference between the first temperature and the second temperature of the slave BMS is greater than the preset value, the slave BMS being the associated slave BMS.

13. The automatic ID allocation system of claim 12, wherein the first transmission unit transmits a first signal to the associated slave BMS, wherein the slave BMS further comprises an RSSI level detection unit configured to detect a Received Signal Strength Indication (RSSI) level for the reception strength of the first signal received by the second reception unit.

14. The automatic ID allocation system of claim 13, wherein the second transmission unit transmits the RSSI level value for the reception strength of the first signal to the master BMS, wherein the master BMS further comprises an ID allocation unit configured to allocate a n-th ID (n is a natural number) corresponding to the slave BMS when the RSSI level value received from the slave BMS is greater than the RSSI level value received from another associated slave BMS, wherein the first transmission unit transmits the n-th ID allocation information to the slave BMS.

15. The automatic ID allocation system of claim 14, wherein after allocating the n-th ID, the reception unit receives the RSSI level for the reception strength of the signal strength measurement signal received from the associated slave BMS to which the n-th ID is allocated by a plurality of associated slave BMSs except for the associated slave BMS to which the ID is allocated by the ID allocation unit, wherein the ID allocation unit allocates an (n+1)-th ID to an associated slave BMS transmitting the largest RSSI level based on the RSSI level received from each of the plurality of associated slave BMSs except for the associated slave BMS to which the ID is allocated.

16. The automatic ID allocation system of claim 15, wherein the control unit allows the ID allocation unit to repeat the ID allocation operation until n+1, which is the number of IDs allocated by the ID allocation unit, is equal to the number of associated slave BMSs transmitting the association signal.

* * * * *